(12) United States Patent
Talvitie (10) Patent No.: US 12,422,478 B2
(45) Date of Patent: Sep. 23, 2025

(54) DEBUG ARCHITECTURE

(71) Applicant: Nordic Semiconductor ASA, Trondheim (NO)

(72) Inventor: Hannu Talvitie, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 17 days.

(21) Appl. No.: 18/269,511

(22) PCT Filed: Jan. 13, 2022

(86) PCT No.: PCT/EP2022/050671
§ 371 (c)(1),
(2) Date: Jun. 23, 2023

(87) PCT Pub. No.: WO2022/152806
PCT Pub. Date: Jul. 21, 2022

(65) Prior Publication Data
US 2024/0044979 A1 Feb. 8, 2024

(30) Foreign Application Priority Data
Jan. 13, 2021 (GB) ........................ 2100413

(51) Int. Cl.
*G01R 31/3177* (2006.01)
(52) U.S. Cl.
CPC ............................... *G01R 31/3177* (2013.01)
(58) Field of Classification Search
None
See application file for complete search history.

(56) References Cited

FOREIGN PATENT DOCUMENTS

| EP | 1 089 182 A2 | 4/2001 | |
|---|---|---|---|
| GB | 2543804 A * | 5/2017 | ......... G01R 31/2851 |
| WO | WO 2017/072500 A1 | 5/2017 | |
| WO | WO 2019/238431 A1 | 12/2019 | |
| WO | WO 2020/002423 A1 | 1/2020 | |

(Continued)

OTHER PUBLICATIONS

"ARM's System Trace Macrocell (STM)," Asset-Intertech, downloaded from https://www.asset-intertech.com/company/press/media-resources/arm-s-system-trace-macrocell-stm, on Jul. 27, 2020, 2 pages.

(Continued)

*Primary Examiner* — Guerrier Merant
(74) *Attorney, Agent, or Firm* — Klarquist Sparkman, LLP (57) ABSTRACT

An integrated-circuit chip and method of operating said chip is provided. The integrated-circuit chip includes multiple processors, a system memory and a main system bus for carrying data between each of the processors and the system memory. The chip also has debug logic, a debug port for communicating with the debug logic from outside the chip and a debug connection that connects the debug logic to the main system bus. A power management system is also included for controlling the power supplied to each of a number of power domains on the chip. The debug logic and each of the processors are in different respective power domains. The debug logic is configured to send a debug instruction to any of the processors. The debug instruction is communicated over the debug connection and over the main system bus.

20 Claims, 4 Drawing Sheets

(56) References Cited

FOREIGN PATENT DOCUMENTS

WO WO 2020/002441 A1 1/2020
WO WO-2022152806 A1 * 7/2022 ......... G01R 31/3177

OTHER PUBLICATIONS

Blog, "Debugging with ARM Coresight—Part 1," Nov. 16, 2014, downloaded from https://blog.asset-intertech.com/test_data_out/2014/11/debugging-with-arm-coresight-part-1.html on Nov. 6, 2020, 2 pages.

Blog, "How to debug: CoreSight basics (Part 3)," Jul. 13, 2015, downloaded from https://community.arm.com/developer/ip-products/processors/b/processors-ip-blog/posts/how-to-debug-coresight-basics-part-3, on Jul. 7, 2020, 19 pages.

"CoreSight™ System Trace Macrocell," ARM Technical Reference Manual, 20100, 86 pages.

International Search Report and Written Opinion for PCT/EP2022/050671, mailed Mar. 7, 2022, 14 pages.

IPO Search Report under Section 17(5) for GB2100413.0, mailed Nov. 3, 2021, 3 pages.

Orme, "Debug and Trace for Multicore SoCs," ARM White Paper, Sep. 2008, pp. 1-6.

"STM32MP1—DBG," downloaded from httpswww.st.comcontentcc-cresourcetrainingtechnicalproduct_traininggroup009651152d0c54842STM32MP1-System-Debug_DBGfilesSTM32MP1-System-Debug_DBG.pdfjcrcontenttranslationsen.STM32MP1-System-Debug_DBG.pdf, undated, 25 pages.

"System Trace Macrocell Packs Major Benefits for High-Performance SoC System Debug," Altera®, White Paper WP-01229-1.0, Sep. 2014, 6 pages.

Taubinger, "Kill Bugs efficiently with Code Trace," IAR Systems, undated, 23 pages.

* cited by examiner

DEBUG ARCHITECTURE

CROSS REFERENCE TO RELATED APPLICATIONS

This is the U.S. National Stage of International Application No. PCT/EP2022/050671, filed Jan. 13, 2022, which was published in English under PCT Article 21(2), which in turn claims the benefit of Great Britain Application No. 2100413.0, filed Jan. 13, 2021.

BACKGROUND OF THE INVENTION

The present invention relates to a debug architecture on an integrated-circuit chip.

When developing software to be executed on integrated-circuit devices such as systems-on-chip (SoC) or radios-on-a-chip, it is important to be able to find and identify "bugs" in the software. Software developers have historically used in-circuit emulators (ICE) to run programs on an emulator, in place of the actual integrated-circuit device. This allows code execution to be monitored, halted and stepped through to observe and fix any irregularities. In recent times, instead of emulating the integrated-circuit chip, it is more typical to gain direct access to the processor or processors on the actual chip through a debug port—e.g. a Joint Test Action Group (JTAG) port or an Arm™ CoreSight™ serial wire debug port (SW-DP) port—for monitoring the execution of software using a software development environment executing on a separate device such as a personal computer (PC) or workstation.

The software development environment can include a debugger, which can be connected to the external debug port of the chip and can allow a developer to perform operations such as setting breakpoints; halting, running and stepping processors on the chip; loading instructions to a processor; and reading and writing to registers and memory on the chip. In some cases, memory and register access may be possible in real time, even while one or more processors is running.

As well as supporting such interactive debugging operations, processors on a chip may generate trace information as they execute code, which can be output to a trace port analyser through an external trace port. Such trace information can include instrumentation trace data, generated whenever a special trace software instruction in the program code is executed (e.g. a printf type command), and execution trace data (also known as instruction tracing) that allows the whole program flow to be traced.

The growing complexity of integrated-circuit chip designs, which often now include multiple processor cores, has increased the necessity for robust debug architectures. In the Arm™ CoreSight™ architecture, for example, debug transactions from an external debug port (e.g. a serial wire debug (SWD) or JTAG port) are transported to a particular processor through a dedicated debug bus connection for that processor.

Modern SoCs can have multiple independent power domains across the chip. This can reduce power usage by enabling a power management unit on the chip to disable the power supply to one or more of the domains when the components (e.g. processor core) in that domain are not being used. Controlling the turning on and off of these power domains is complicated and, if not done correctly, can result in system failures or data losses. In particular, when sending a signal across a power domain boundary it is necessary to ensure the destination domain is powered on, and it may also be necessary for the signal to be level-shifted to compensate for any voltage change between the domains. Signal paths that cross power domain boundaries, including the signal paths in conventional debug buses, therefore present significant complexity in the chip design.

The present invention seeks to provide a debug architecture that can reduce this problem.

SUMMARY OF THE INVENTION

According to a first aspect, the invention provides an integrated-circuit chip comprising:
  a plurality of processors;
  a system memory;
  a main system bus for carrying data between each of the plurality of processors and the system memory;
  debug logic;
  a debug port for communicating with the debug logic from outside the chip;
  a debug connection that connects the debug logic to the main system bus; and
  a power management system for controlling the power supplied to each of a plurality power domains on the chip;
wherein the debug logic and each of the plurality of processors are in different respective power domains of the plurality of power domains; and
wherein the debug logic is configured to send a debug instruction to any of the plurality of processors, wherein the debug instruction is communicated over the debug connection and over the main system bus.

According to a second aspect, the invention provides a method of operating an integrated-circuit chip, wherein the chip comprises:
  a plurality of processors;
  a system memory;
  a main system bus configured to carry data between each of the plurality of processors and the system memory;
  debug logic;
  a debug port for communicating with the debug logic from outside the chip;
  a debug connection that connects the debug logic to the main system bus; and
  a power management system for controlling the power supplied to each of a plurality power domains on the chip; and
wherein the debug logic and each of the plurality of processors are in different respective power domains of the plurality of power domains, the method comprising:
  the debug logic sending a debug instruction to a processor of the plurality of processors, wherein the debug instruction is communicated first over the debug connection and then over the main system bus.

Thus it will be seen that, instead of each processor being accessible by the debug logic only over respective dedicated debug bus connections, the processors can instead receive debug instructions from the debug logic over the main system bus, via a shared debug connection between the debug logic and the main system bus. By providing a debug connection to the main system bus, through which all of the processors can be accessed, the number of power domain crossings in the system can be reduced, compared with having only a plurality of individual direct debug connections. This enables the power domains and implementation of power domain crossings to be simpler in design and operation.

The debug logic may be further configured to send debug instructions to one or more peripherals and/or to the system memory over the debug connection and then over the main system bus. The chip may be arranged for sending debug instructions from the debug logic over the main system bus.

The debug logic may be further configured to receive debug data from any of the plurality of processors, over the main system bus and then over the debug connection. The debug logic may be configured to receive debug data from one or more peripherals and/or from the system memory over the main system bus and then over the debug connection. The debug data may comprise debug output data that is sent in response to the debug instruction. The chip may be arranged for sending debug data to the debug logic over the main system bus.

The main system bus may comprise a data bus having a set of data lines. Debug data (e.g. debug instructions and/or debug output) may be sent over the same set of data lines as data travelling between the system memory and at least one of the plurality of processors. The main system bus may comprise an address bus having a set of address lines. Trace or debug data may be carried in bus transactions that are addressed using the same set of address lines as bus transactions between the system memory and the plurality of processors.

The main system bus may be any type of bus, but in some embodiments it is an Arm™ Advanced Microcontroller Bus Architecture (AMBA) bus. The chip may have shared or separate data and instruction busses. The chip may implement an AMBA bus architecture. The main system bus may be or comprise an Advanced High-performance Bus (AHB) and/or an Advanced eXtensible Interface (AXI) bus. It may be a multi-layer bus—e.g. a multi-layer AHB. It may comprise one or more bus arbiters, multiplexers, crossbars, decoding logic, etc. It may be a single bus, or it may comprise a plurality of individual buses, e.g. connected by one or more bridges.

However, it will be understood that the main system bus, as used herein, includes only such buses as are able to carry data between one or more of the processors and the system memory. In particular, it does not include any buses configured only to communicate debug or trace data, such as any AMBA Trace Bus (ATB) or ARM™ CoreSight™ Debug Access Port Bus (DAP).

The system memory may comprise volatile memory such as RAM and/or a non-volatile memory—e.g. ROM or flash memory. The main system bus may also be arranged to carry data between each of the plurality of processors and a memory controller for part or all of the system memory. The main system bus may be arranged to carry data between each of the plurality of processors and one or more system peripherals.

The debug connection may comprise a set of one or more lines, which may include address lines and data lines. The same line or set of lines in the debug connection may be used to carry respective debug instructions for at least two different processors, of the plurality of processors, from the debug logic. The debug connection may also be configured to carry debug data from the main system bus to the debug logic. The debug connection may be bi-directional.

The debug logic may comprise the debug port. The debug port, or the debug logic more generally, may be a bus master on the main system bus. The debug connection may connect the main system bus to an input of the debug logic or debug port, e.g. for receiving debug data such as register values from a processor.

The debug port may be arranged for communication with a debugger outside the chip. It may support bidirectional communication. The debug port may be arranged to receive said debug instruction, or data representative of the debug instruction, from outside the chip. It may be arranged to receive data identifying a processor of the plurality of processors to which to send the debug instruction.

The debug instruction may comprise a breakpoint instruction—e.g. an instruction for setting a breakpoint. It may comprise an instruction to halt or run or step a processor of the plurality of processors. It may comprise a processor instruction, for execution by a processor of the plurality of processors—e.g. an instruction to read from or write to a memory address on the chip. The chip may support debugging of a processor of the plurality of processors while the processor is running.

The debug port may comprise an external chip interface, which may comprise a set of pins or pads.

The debug port may comprise an Arm™ CoreSight™ Debug Access Port (DAP) or a Joint Test Action Group (JTAG) port.

The chip may further comprise trace logic. It may comprise a trace port for communicating with the trace logic (e.g. for outputting trace data from the chip). The trace logic may comprise the trace port. The trace logic may be in a different power domain from the plurality of processors. The trace logic and the debug logic may together provide trace and debug logic for the chip. The trace logic may be configured to receive trace data from any of the plurality of processors, wherein the trace data is communicated over the main system bus and over a trace connection that connects the trace logic to the main system bus. The chip may comprise a trace connection for carrying trace data from the main system bus to the trace logic. The same line or set of lines in the trace connection may be arranged to carry respective trace data from at least two different processors, of the plurality of processors, to the trace logic. The trace connection may share one or more lines in common with the debug connection or may be entirely distinct from the debug connection. The chip may be configured to send trace data from any of the plurality of processors to the trace logic over the main system bus. The trace port may be wholly separate from the debug port (e.g. not having any pins or pads in common), or they may be comprise a combined trace and debug chip interface (e.g. having one or more pins or pads in common).

The trace port may comprise a set of pins or pads. It may comprise an Arm™ CoreSight™ High Speed Serial Trace Port (HSSTP) or an Arm™ CoreSight™ Trace Port Interface Unit (TPIU).

The debug logic and/or the trace logic may comprise electronic circuitry (e.g. comprising hardware logic gates) that is distinct from the circuitry of the processors on the chip.

The trace and/or debug logic may comprise one or more Arm™ CoreSight™ trace or debug components.

The trace logic may comprise at least one Arm™ CoreSight™ System Trace Macrocell (STM). In one set of embodiments, the plurality of processors share one or more STMs. In another set of embodiments, the trace logic may comprise a plurality of STMs such that each of the plurality of processors is connected to a different respective STM.

The trace logic may comprise a trace port interface unit, which may be a CoreSight™ Trace Port Interface Unit (TPIU), for outputting trace data through the external trace port—e.g. to an external trace analyser. The trace connection may connect the main system bus to an input of the trace port interface unit. The trace port interface unit may be a slave device on the main system bus. Alternatively, trace data may be stored into an embedded trace buffer or RAM on the chip.

In some such embodiments the chip does not necessarily have a dedicated external trace port at all. Instead, the trace data may be output using the debug port. The trace logic may comprise a buffer or region of RAM for storing trace data received from a processor of the plurality of processors—e.g. a suitable buffer would be a Coresight™ Embedded Trace Buffer (ETB). The buffer or region of RAM may output to a dedicated trace port or be accessed by the debug port.

One or more, or each, of the plurality of processors may comprise an instrumentation trace unit—e.g. a CoreSight™ Instrumentation Trace Macrocell (ITM)—configured to output instrumentation trace data.

One or more, or each, of the plurality of processors may comprise an execution trace unit—e.g. a CoreSight™ Embedded Trace Macrocell (ETM)—configured to output execution trace data to the trace logic. Each ETM may be connected to the trace logic via a dedicated trace bus, e.g., a CoreSight™ AMBA Trace Bus (ATB).

One or more, or each, of the plurality of processors may comprise a respective data watchpoint unit—e.g. a CoreSight™ Data Watchpoint and Trace Unit (DWT)—configured to receive debug instructions from the main system bus. The data watchpoint unit may be a slave device on the main system bus.

One or more, or each, of the plurality of processors may comprise a respective breakpoint unit—e.g. a CoreSight™ Breakpoint Unit (BPU)—configured to receive debug instructions from the main system bus. The breakpoint unit may be a slave device on the main system bus.

One or more, or each, of the plurality of processors may comprise a respective access port configured to output debug data to the main system bus for the debug logic. The access port may be a master device on the main system bus.

The main system bus may comprise a bus arbiter for prioritising bus transactions on the main system bus. The bus arbiter may be configured to prioritise debug data transactions (e.g. a bus transaction associated with the debug instruction or debug output data) differently (e.g. lower or higher) than a read and/or write and/or instruction fetch transaction between a processor of the plurality of processors and the RAM. It may be configured to prioritise trace data different (e.g. lower or higher) than a read and/or write and/or instruction fetch transaction between a processor of the plurality of processors and the RAM. In this way, debug and/or trace data can potentially be given a lower priority than "normal" data on the main system bus, and so reduce the impact of debugging and/or tracing activity on the normal execution of software by the processors. Alternatively, in some situations, the debug and/or trace data may be given a higher priority than some other bus transactions, to increase responsiveness for debugging or tracing.

The chip may be configured (e.g. within its bus architecture) to distinguish between debug transactions on the main system bus and memory read and/or write and/or instruction fetch transactions on the main system bus. In some embodiments, the main system bus may be configured to carry an identifier for each bus transaction—e.g. in an AHB or AXI transaction ID field—which may identify the bus master that initiates a bus transaction. The main system bus may be configured to use the identifier and/or a target address for a bus transaction to identify the bus transaction and/or to determine a priority for the bus transaction. One or more bus arbiters may be configured to prioritise trace and/or debug data transactions differently from some or all other transactions on the main system bus (i.e. non-trace and/or non-debug transactions). The configuration of the one or more bus arbiters may be hard-wired or may be user-configurable (e.g. through one or more register settings). In some embodiments, the chip may additionally comprise a direct trace and/or debug connection between a processor of the plurality of processors and the trace and/or debug logic, for sending trace or debug data between the processor and the trace and/or debug logic without the trace or debug data travelling over the main system bus. In particular, in some embodiments, the chip may comprise a direct trace connection between an execution trace unit of a processor of the plurality of processors and the trace logic. A dedicated trace bus may be useful for sending high-bandwidth execution (instruction) trace data from the processor to the trace logic without overloading the main system bus. However, in such embodiments, instrumentation trace data may still be sent over the main system bus, since these are typically lower-bandwidth. A dedicated debug bus may be useful for sending certain types of debug instructions, such as JTAG protocol access, over direct debug connections in embodiments, in situations where such types of instruction are not well suited for sending over the main system bus. However, in such embodiments, certain other types of debug instruction and/or or debug data can still be sent over the main system bus.

In a set of embodiments, wherein the main system bus is configured to carry an identifier for each bus transaction, said identifier is used by the chip to prevent or allow a transaction to access one or more areas of the chip. For instance, the identifier of a "debug" or "non-debug" transaction on the system bus, when used for permission control, may improve the security of confidential or protected regions. For example, the chip may be configured to control permission of debug and non-debug transactions to processors or system memory differently.

The trace and/or debug logic may comprise a dedicated trace bus, such as a CoreSight™ AMBA Trace Bus (ATB), and/or a dedicated debug bus, such as a CoreSight™ Debug Access Port (DAP) bus. However, this is not essential, since, in some embodiments, all trace and/or debug data can be sent via the main system bus instead.

The chip may comprise a plurality of clock sources providing different respective clock signals to a plurality of clock domains on the chip (e.g. clocks of different speeds and/or accuracies). The trace and/or debug logic may be in a different clock domain from one or more of the plurality of processors. In some embodiments, two or more of the plurality of processors may be in respective clock domains that are different from each other and different from a clock domain of the trace and/or debug logic. The ability to send debug data over the main system bus can reduce the total number of clock domain crossings that need to occur when debugging the chip, compared with using direct connections between the processors and the debug logic. This can simplify the design of the chip and/or reduce the risk of metastability issues arising.

The chip may comprise a reset controller for controlling resets in a plurality of reset domains on the chip. The trace and/or debug logic may be in a different reset domain from one or more of the plurality of processors. In some embodiments, two or more of the plurality of processors may be in respective reset domains that are different from each other and different from a reset domain of the trace and/or debug logic. The ability to send debug data over the main system bus can reduce the total number of reset domain crossings that need to occur when debugging the chip, compared with using direct connections between the processors and the debug logic. This can simplify the design of the chip and/or reduce the risk of metastability issues arising when a reset of one or more reset domains occurs.

Each of the plurality of processors may be an Arm™ processor, although this is not essential.

The chip may comprise one or more further processors that are not part of the aforesaid plurality of processors—e.g. which don't have similar debug connections. The chip may be integrated on a single semiconductor wafer—e.g. a silicon wafer. It may be a system-on-chip (SoC). It may comprise inputs for receiving power and/or clock signals and/or digital signals and/or analog signals. It may comprise outputs for outputting digital signals and/or analog signals. It may comprise one or more peripherals, which may be local to a particular processor or which may be connected to the main system bus. It may comprise a radio peripheral. The chip may be a radio-on-a-chip device.

BRIEF DESCRIPTION OF THE DRAWINGS

One or more non-limiting embodiments will now be described, by way of example only, and with reference to the accompanying figures in which.

DETAILED DESCRIPTION

Figure 1:
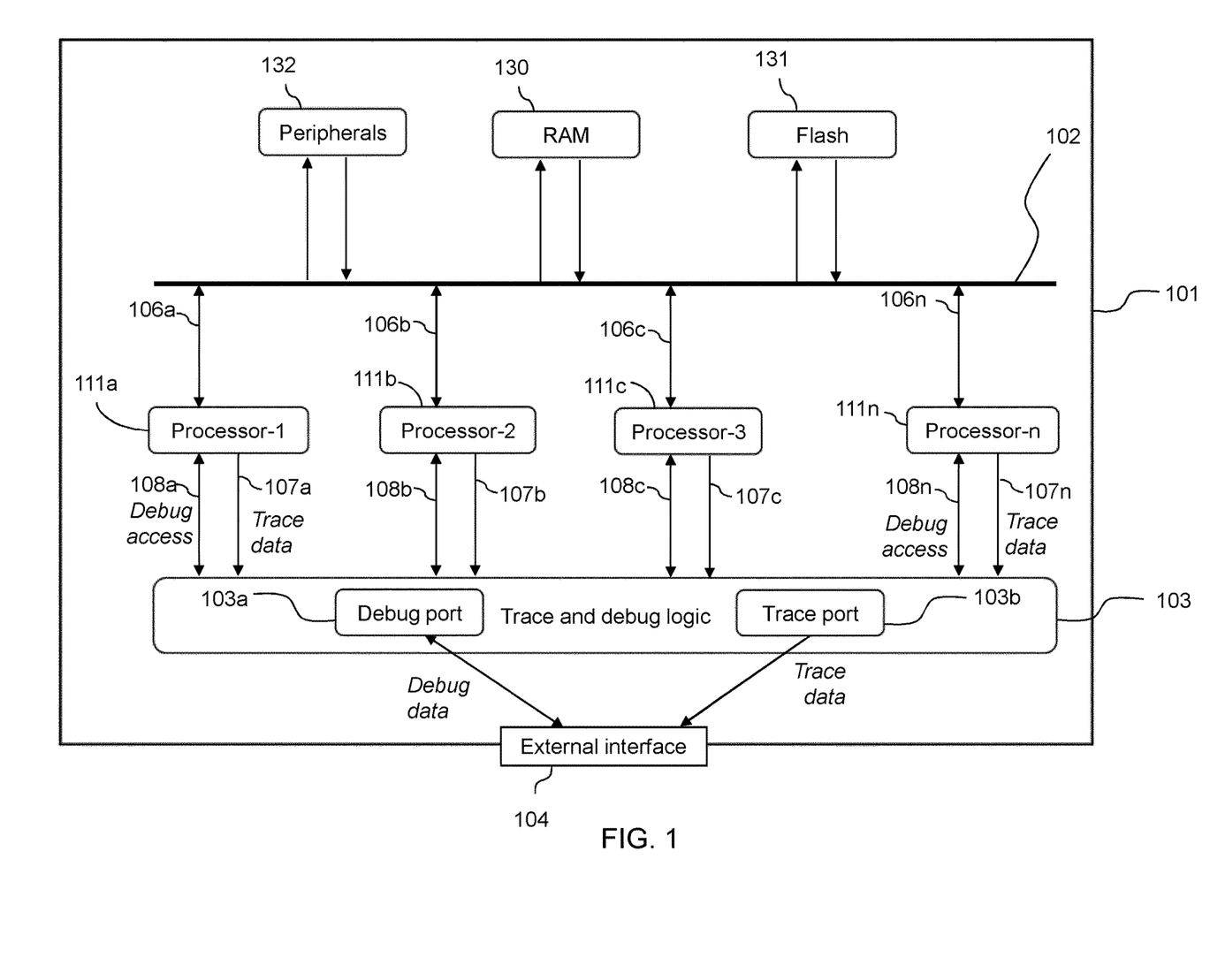
FIG. 1 is a schematic drawing of an integrated circuit chip with naïvely-implemented debug logic, not embodying the invention, by way of background.
Figure 2:
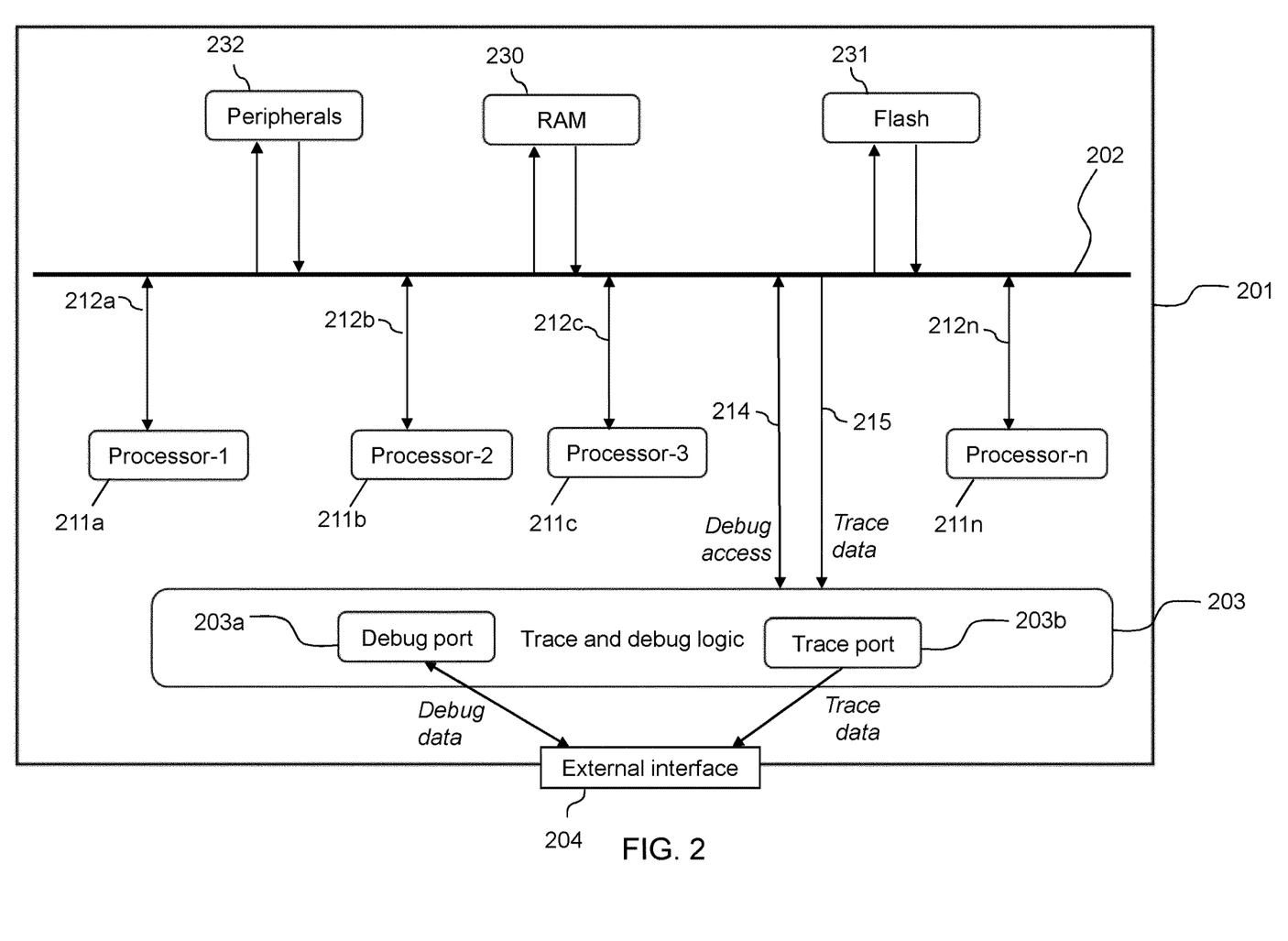
FIG. 2 is a schematic drawing of an integrated circuit chip having a trace and debug bus system embodying the present invention.

FIG. 1 shows, by way of background, a layout of a multi-core silicon integrated-circuit system-on-chip (SoC) 101 with a naïvely-implemented trace and debug architecture, in order to provide context for understanding the embodiment of FIG. 2. This trace and debug system may be based on the Arm™ CoreSight™ specifications.

Such multi-core integrated-circuit chips provide high chip performance and speed, but also have high design complexity which can make them expensive to develop and manufacture, as well as providing more potential for hardware and software design faults.

The SoC device 101 comprises a plurality of n processor cores 111a-111n, for some n>1. Each processor may comprise not only a processor unit, e.g. an Arm™ Cortex-M™ processor, but also its own local bus and/or RAM and/or peripherals, etc. In some examples, some of the processors 111 might be separate microcontroller units (MCU) within the SoC 101.

Each processor 111a-111n in this particular example contains a respective:
Instrumentation Trace Macrocell (ITM), for outputting instrumentation trace data;
Embedded Trace Macrocell (ETM) for outputting execution (instruction) trace data;
Data Watchpoint and Trace Unit (DWT), for setting data watchpoints, Program Counter (PC) sampling, etc.; and
Breakpoint Unit (BPU), for setting hardware breakpoints.

The chip 101 also has system RAM 130 and non-volatile flash memory 131, accessible to the processors 111a-111n over a main system bus 102. The main bus 102 can include one or more control buses, address buses and data buses.

In the naïve approach shown in FIG. 1, trace data is output from each processor 111a-n on the integrated circuit chip 101 to a trace and debug logic unit 103. This trace and debug logic 103 is connected to an external interface 104. The external interface 104 provides a trace port comprising a set of trace pins or pads—e.g. an Arm™ CoreSight™ High Speed Serial Trace Port (HSSTP). It also provides a debug port comprising a set of debug pins or pads—e.g. an Arm™ CoreSight™ Debug Access Port (DAP) or JTAG port.

The processor cores 111a-111n are connected to the trace and debug logic 103 via respective dedicated trace connection lines 107a-n, which are separate from the main bus 102. The trace and debug logic 103 may include a shared trace bus, onto which trace data from these individual trace connections 107a-n is funnelled. The trace port 103b may include a Trace Port Interface Unit (TPIU) for outputting the trace data through the interface 104. A software development environment including a trace data analyser, e.g. running on an external workstation, can be connected to the external interface 104 for receiving the trace data for analysis.

The processor cores 111a-111n are also connected to the trace and debug logic 103 via respective dedicated debug connection lines 108a-n, which are separate from the main bus 102. The logic 103 may include a shared debug bus, to which the individual debug connections 108 are connected, which lead to the debug port 103a. Debug messages (such as an incoming instruction to sample a register value from one of the processor cores 111, or a corresponding outgoing register value output by the core 111 in response to such an instruction) can be exchanged between the chip 101 and an external debugger through the external interface 104. The external debugger may be part of the same software development environment as the trace analyser. Debug data passes through the trace and debug logic 103 between the interface 104 and each processor 111a-n on the respective dedicated debug connections 108a-n.

Each processor 111a-n additionally has a respective bi-directional connection 106a-n to the main bus 102, which it uses for reading data and fetching instructions from, and writing data to, the RAM 130 and flash 131 and to peripherals 132. The lines and control logic (address decoders, arbiters, etc.) of these connections 106 and the main bus 102 are distinct from those of the dedicated trace connections 107 and debug connections 108 and any shared trace and debug buses within the trace and debug logic 103.

The naïve approach described above, wherein each processor 111a-n outputs trace data direct onto a respective dedicated trace connection 107a-n, and exchanges debug transactions over a respective dedicated debug connection 108a-n results in many interconnects on the chip. This complicates the integrated-circuit chip 101 design and increases the number of transistors on the chip 101. Moreover, when the trace connections 107a-n and debug connections 108a-n cross between different power domains, and potentially different clock domains and reset domains, this can create significant domain crossing issues.

In contrast to the naïve approach shown in FIG. 1, the embodiments described below implement a novel debug architecture that reduces the risk of domain crossing issues arising.

FIG. 2 is a schematic of an integrated-circuit system-on-chip 201, according to an embodiment of the invention, comprising multiple processor cores 211a-n. The integrated circuit chip 201 comprises multiple (n>1) processor cores 211a-211n, a main system bus 202, trace and debug logic 203 and an external trace and debug interface 204 (i.e. a set of pins or pads). However, the trace and debug logic 203, and the overall architecture, are different from the naïvely-implemented versions shown in FIG. 1.

The main system bus 202 can contain bus decoders, arbiters and other control logic, as well as one or more sets of address lines, data lines and control lines. It may comprise one or more Advanced Microcontroller Bus Architecture (AMBA) Advanced High-performance Buses (AHB) and/or one or more Advanced eXtensible Interface (AXI) buses.

Each of the processors 211 contains a respective Data Watchpoint and Trace Unit (DWT) and Breakpoint Unit (BPU). However, the DWT and BPU are configured to exchange data over bi-directional connections 212a-n to the main bus 102, which are the same connections that are also used by the processors 211 for fetching instructions and for reading and writing normal (i.e. non-debug or trace) data to the RAM 230 and flash 231 and peripherals 232.

The trace and debug logic 203 is connected directly to the main bus 202 by a debug connection 214 and a trace connection 215. These connections may each comprise a set of data and address lines. The trace and debug logic 203 provides a debug port 203a and a trace port 203b. It may comprise an Arm™ CoreSight™ trace and debug unit. The trace and debug logic 103 here comprises a System Trace Macrocell (STM) which is a source of instrumentation trace data. The trace port 203b may contain a Trace Port Interface Unit (TPIU) and/or High Speed Serial Trace Port (HSSTP), for outputting the trace data through the interface 204. It may comprise memory for buffering trace data, for outputting later. The debug port 203a may include an Arm™ CoreSight™ Debug Access Port (DAP) and/or a JTAG port. Within the trace and debug logic 203, trace data output by the STM (and optional ETM) can be connected to the TPIU and/or other trace sinks such an Embedded Trace Buffer (ETB) or a RAM buffer; these connection within the trace and debug logic 203 may use CoreSight™ infrastructure such as one or more ATB point to point buses.

A software development environment including a trace data analyser, e.g. running on an external workstation, can be connected to the external interface 104 for receiving the trace data for analysis. Low-bandwidth debug transactions and trace data can thereby be sent between the processors 211a-n and the trace and debug logic 203 via the main bus 202, rather than needing to use dedicated trace and debug connections between the trace and debug logic 203 and each processor 211.

In particular, debug messages (e.g. debug instructions and debug output) can be exchanged between an external debugger and a processor 211 (and optionally peripherals 232, RAM 230 or flash 231) over the main bus 202, rather than requiring a dedicated debug connection between the debug logic 203 and each processor 111a-n. This differs fundamentally from a naïve architecture, such as that in FIG. 1, in which each processor 111a-n only has dedicated debug connections 108a-n connecting the processors 111a-n to a dedicated debug bus within the trace and debug logic 103.

This configuration of the chip 201 results in the main system bus 202 being shared by bus transactions comprising normal data (e.g., instruction fetches and read and write data) and bus transactions comprising trace data and debug data.

The bus transactions on the main bus 202 may, in some embodiments, be prioritised by one or more bus arbiters. A lower priority may, for instance, be applied to debug data, so that debugging operations do not impact negatively on processor execution.

Figure 3:
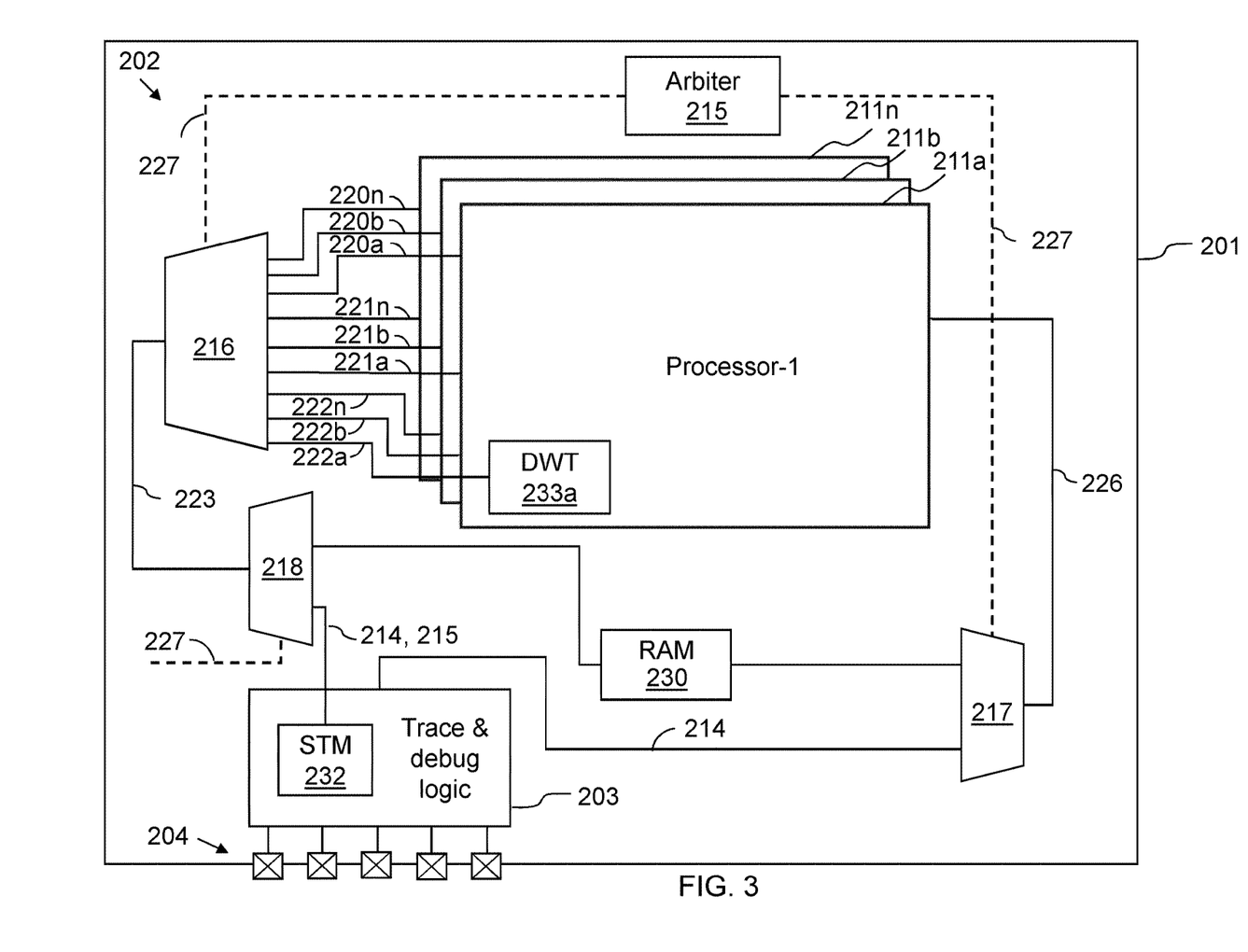
FIG. 3 is a schematic drawing showing more detail of the bus system of the integrated circuit chip.

FIG. 3 schematically shows some of the connections in the main bus 202 in greater detail, which enable normal data and trace & debug data to share the same bus 202 efficiently.

The main system bus 202 comprises multiplexers 216, 217, 218 and a bus arbiter 215 which controls the multiplexers 216, 217, 218 using control lines 227. A representative set of bus interconnects 220, 221, 222, 223, 226 are shown in FIG. 3. It will be appreciated that, in reality, the bus matrix and control logic may be far more complex than is shown here.

The central processing unit of each processor 211a-n has a connection 220a-n to a multiplexer 216 of the main bus 202, for sending bus transfers to the RAM 230, flash 231 and peripherals 232.

The trace and debug logic 203 in this embodiment includes an Arm™ CoreSight™ System Trace Macrocell (STM) 232, which can collect trace information, including software trace data, hardware trace data, timestamps, and printf( ) style debugging. The STM may be used instead of an ITM to collect instrumentation trace data. The STM 232 is a slave on the main system bus 202. The STM 232 slave triggers each of the plurality of processors 211 to write software instrumentation and hardware events to its input via the main bus 202, and outputs trace data for outputting through the interface 204. Such instrumentation and hardware events are output from each of the plurality of processors 211a-n via a respective connection 221a-n to the multiplexer 216.

On the debug side, each of the processors 211a-n includes a respective DWT 233a-n, each with its own connection 222a-n to the multiplexer 216, which it can also use to send debug data to the trace and debug logic 203. The BPUs in the processors 211a-n may also be connected to the main bus 202 through the arbiter 216. The debug port 203a (comprising a Debug Access Port) may be coupled with individual processor access ports (APs), which may be masters to the main system bus 202.

All addressing of debug transactions from the debug port 203a between processor APs is handled by the main system bus 202. Similarly, all addressing of trace data to the STM 232 is handled by the main system bus 202.

The processors 211a-n also have input connections 226 and suitable multiplexers 217 for receiving data over the main bus 202. These connections 226 are not shown in as much detail in FIG. 3, for simplicity. They enable the CPUs in the processors 211a-n to receive instructions and data from the memory 230, 231, while also enabling the DWT 233 and BPU of each processor to receive debug instructions from the trace and debug logic 203.

The trace and debug connections 214, 215 carry trace and debug data between the processors 214a-n and the trace and debug logic 203 via the same physical main system bus data and address lines 223, 226 that are also used to carry data to and from the RAM 230, flash 231 and other peripherals 232, and the processors 211a-n.

The bus arbiter 215 decides which bus master is allowed to send data over the main bus 202 at each cycle. Each bus transaction encodes an identifier of the master in an AHB or AXI transaction ID field, which, in combination with the target address, enables the bus arbiter 215 to determine whether the transaction represents trace data, debug data or other data. In some embodiments, the trace and debug transactions are prioritised lower by the bus arbiter 215 than the normal data messages that would normally be carried on the main system bus 202. Also, trace and debug transactions may potentially be given different permissions compared to other transactions—e.g. permission to access the system memory or one or more (or all) of the processors. In this way, the processors and/or portions of the system memory may be protected against access from unauthorised parties.

The prioritisation may be hard-coded in the bus arbiter 215 (and in other arbiters in the bus fabric 202, not shown in FIG. 3), or may be programmable, depending on data stored in memory, e.g. the flash memory 231, or in one or more registers.

Some or all of the processors 211a-n are in different power domains from each other, and optionally are also in different reset domains and clock domains from each other.

The chip 201 shown in FIG. 2 has a reduced number of interconnects compared with the naïve approach of FIG. 1. This simplification can be advantageous in itself, e.g. by reducing design and manufacturing cost. However, further advantages arise because of one or more of the processors 211a-n being in a different respective power domain from the trace and debug logic 203, wherein the architecture of FIG. 2 results in fewer and less complex power domain boundary crossings than that of FIG. 1, when sending trace and debug data over the main system bus 202. It may also result in fewer reset and/or power domain crossings. This can avoid the need to provide as much circuitry for ensuring safe boundary crossings, such as level-shifters and synchronisation logic, or at least reduce the amount of wiring and such circuitry that needs to be used.

Although FIG. 2 shows an embodiment having no dedicated trace and/or debug connections directly between the processors 111a-n and the trace and debug logic 203, some embodiments may still have one or more such connections—i.e. connections that bypass the main bus 202, similar to the connections 107, 108 in FIG. 1. In particular, in some embodiments, there may be a direct trace connection from an ETM of at least one processor 111 to the trace and debug logic 203. This may be useful for enabling instruction trace data, which is typically high-bandwidth, to be output from the processor 111, when required, without risking overloading the main bus 202, while lower-bandwidth instrumentation trace data and debug messages from the processors 111a-n can be sent over the main bus 202 using the STM 232. Unless every processor 111a-n has dedicated trace and debug connections, this can still result in fewer physical domain crossing points. Even in embodiments in which there are as many domain crossing point as in FIG. 1, the option of using the main bus 202 for trace and/or debug messages can allow some of the crossing logic to be used less often, thereby reducing power consumption and the complexity of domain crossing implementation.

Figure 4:
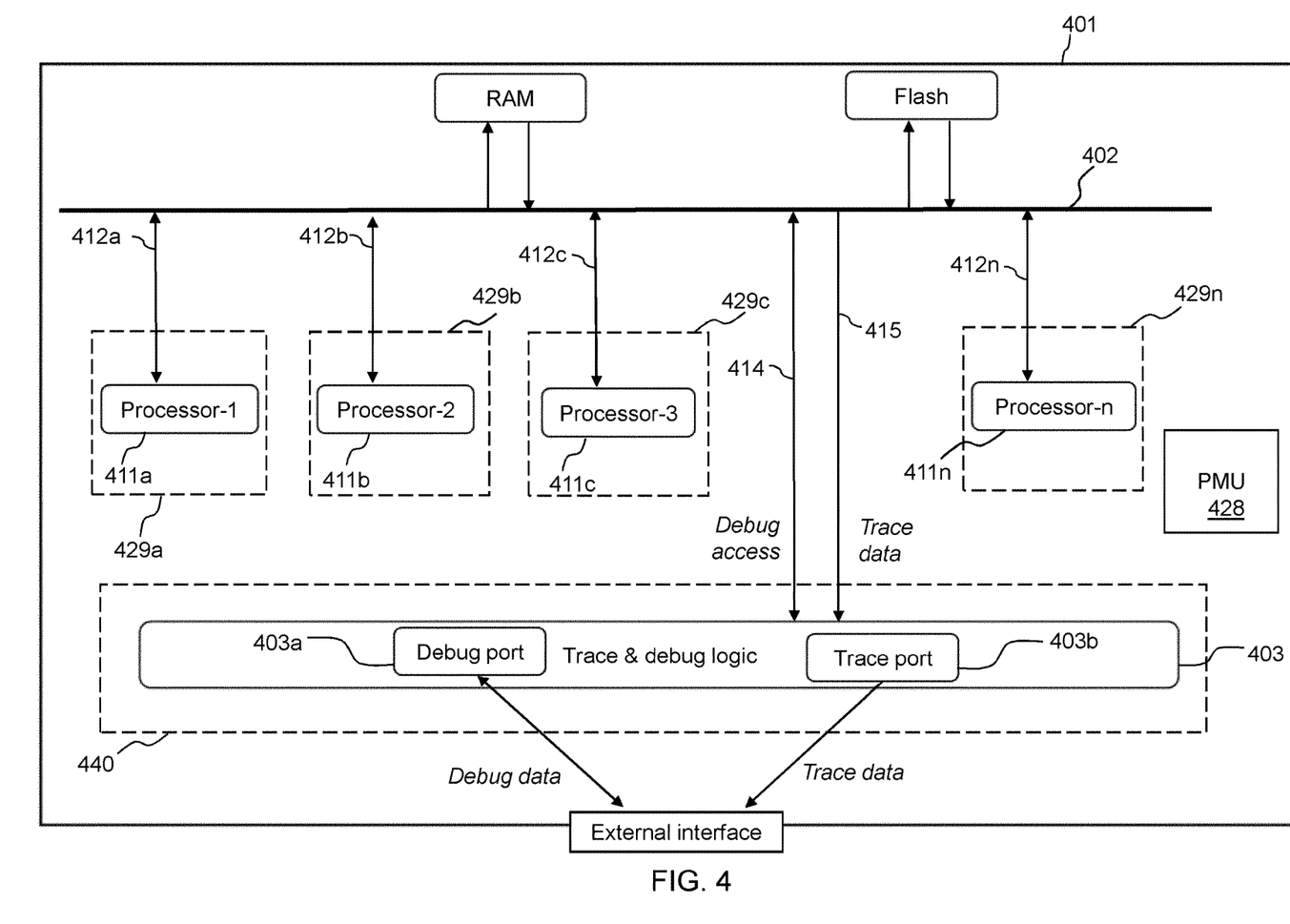
FIG. 4 is a schematic drawing of a trace and debug bus system on an integrated circuit chip, embodying the present invention, comprising multiple processors and multiple power domains.

FIG. 4 schematically shows an embodiment that is similar to that of FIG. 2, but in which each of the multiple processor cores 411a-n is located in a different respective power domain 429a-n.

It can be seen that sending trace and debug data over the main bus 402 results in fewer power-domain boundary crossings. Where some or all of the processors 411a-n are in different respective clock and/or reset domains from each other and/or from the trace and debug logic 403, the trace and debug data will also cross fewer clock-domain and reset-domain boundaries.

The integrated-circuit chip 401 comprises a Power Management Unit (PMU) 428 which controls the power supply to the power domains 429a-n. In this embodiment, the processors 411a-n lie within respectively different power domains 429a-n, and the trace and debug logic 403 lies in another separate power domain 440. The PMU 428 and main system bus 402 may both be situated within a top-level power domain that is always on when the chip 401 is powered up. However, in other implementations, the main system bus 202 may be powered up in response to transactions triggered by a bus master or bus masters. The power domain boundaries 429a-n, 440 are represented by dashed-line boxes.

The interconnects 412a-n, 413a-n between the processor cores 411a-n and the main system bus 402 each cross one power domain boundary, as do the trace connection 415 and debug connection 414 between the main system bus 402 and the trace and debug logic 403. It will be appreciated that, by sharing the debug transactions with the normal data transactions on the main system bus 402, the total number of domain crossing events that occur when debugging the chip 404 can be substantially reduced. This difference grow as the total number of processor cores 411a-n increases. The likelihood of domain crossing problems such as data-loss, system failure, and metastability can therefore be reduced by such an architecture.

While the invention has been described in detail in connection with only a limited number of embodiments, it should be understood that the invention is not limited to such disclosed embodiments. Rather, the invention can be modified to incorporate any number of variations, alterations, substitutions or equivalent arrangements not described, but which are commensurate with the scope of the invention as defined in the accompanying claims. While various embodiments of the invention have been described, it is to be understood that aspects of the invention may include only some of the described embodiments.

The invention claimed is:

1. An integrated-circuit chip comprising:
   a plurality of processors;
   a system memory;
   a main system bus for carrying data between each of the plurality of processors and the system memory;
   debug logic;
   a debug port for communicating with the debug logic from outside the chip;
   a debug connection that connects the debug logic to the main system bus; and
   a power management system for controlling the power supplied to each of a plurality power domains on the chip;
   wherein the debug logic and each of the plurality of processors are in different respective power domains of the plurality of power domains;
   wherein the debug logic is configured to send a debug instruction to any of the plurality of processors, wherein the debug instruction is communicated over the debug connection and over the main system bus;
   wherein the main system bus comprises a bus arbiter configured to prioritize bus transactions on the main system bus; and
   wherein the bus arbiter is configured to prioritize a bus transaction associated with the debug instruction higher or lower than a memory read or write transaction between a processor of the plurality of processors and the system memory.

2. The integrated-circuit chip of claim 1, wherein the debug logic is further configured to receive debug data from any of the plurality of processors over the main system bus and then over the debug connection.

3. The integrated-circuit chip of claim 1, wherein the debug logic is further configured to send debug instructions to, and/or receive debug data from, the system memory and/or one or more peripherals over the debug connection and over the main system bus.

4. The integrated-circuit chip of claim 1, wherein the main system bus comprises a data bus having a set of data lines, and wherein the chip is configured to send debug data over the same set of data lines as data travelling between the system memory and at least one of the plurality of processors.

5. The integrated-circuit chip of claim 1, wherein the main system bus comprises an Advanced High-performance Bus (AHB) or an Advanced extensible Interface (AXI) bus.

6. The integrated-circuit chip of claim 1, wherein the system memory comprises random access memory (RAM) and/or non-volatile memory, and wherein the main system bus is arranged to carry data between each of the plurality of processors and a memory controller for the RAM or non-volatile memory.

7. The integrated-circuit chip of claim 1, wherein the debug connection comprises a line for carrying respective debug instructions for at least two different processors of the plurality of processors, from the debug logic to the main system bus.

8. The integrated-circuit chip of claim 1, wherein the debug port comprises an external chip interface comprising a set of debug pins or pads.

9. The integrated-circuit chip of claim 1, wherein the debug logic is configured to be a bus master on the main system bus.

10. The integrated-circuit chip of claim 1, wherein the debug port is arranged to receive said debug instruction, or data representative of the debug instruction, from a debugger outside the chip.

11. The integrated-circuit chip of claim 1, wherein one or more of the plurality of processors comprises a respective data watchpoint unit and/or a respective breakpoint unit configured to receive debug instructions from the debug logic over the main system bus.

12. The integrated-circuit chip of claim 1, wherein the debug instruction comprises: a breakpoint instruction; an instruction to halt a processor of the plurality of processors; an instruction to run a processor of the plurality of processors; an instruction to step a processor of the plurality of processors; or a processor instruction for execution by a processor of the plurality of processors.

13. The integrated-circuit chip of claim 1, wherein one or more of the plurality of processors comprises a respective access port for outputting debug data to the main system bus for the debug logic.

14. The integrated-circuit chip of claim 1, wherein the debug port comprises an Arm™ CoreSight™ Debug Access Port (DAP) or a Joint Test Action Group (JTAG) port.

15. The integrated-circuit chip of claim 1, further comprising trace logic and a trace connection for carrying trace data from the main system bus to the trace logic, wherein the trace connection comprises a line for carrying respective trace data from at least two different processors, of the plurality of processors, to the trace logic.

16. The integrated-circuit chip of claim 15, wherein the trace logic comprises a buffer or region of RAM for storing trace data received from a processor of the plurality of processors and/or comprises a trace port interface unit for outputting trace data through an external chip interface.

17. The integrated-circuit chip of claim 1, further comprising a plurality of clock sources providing different respective clock signals to a plurality of clock domains on the chip, wherein the debug logic is in a different clock domain from one or more of the plurality of processors.

18. The integrated-circuit chip of claim 1, further comprising a reset controller for controlling resets in a plurality of reset domains on the chip, wherein the debug logic is in a different reset domain from one or more of the plurality of processors.

19. The integrated-circuit chip of claim 1, wherein the main system bus is configured to carry a respective identifier for each bus transaction, wherein the identifier identifies a bus master that initiated the respective bus transaction; and wherein the integrated-circuit chip is configured to use the identifiers to prevent or allow bus transactions to access one or more areas of the integrated-circuit chip, including to permit a bus transaction associated with the debug instruction to access the system memory or a processor of the plurality of processors.

20. A method of operating an integrated-circuit chip, wherein the chip comprises:
a plurality of processors;
a system memory;
a main system bus configured to carry data between each of the plurality of processors and the system memory, wherein the main system bus comprises a bus arbiter configured to prioritize bus transactions on the main system bus;
debug logic;
a debug port for communicating with the debug logic from outside the chip;
a debug connection that connects the debug logic to the main system bus; and
a power management system for controlling the power supplied to each of a plurality power domains on the chip; and
wherein the debug logic and each of the plurality of processors are in different respective power domains of the plurality of power domains,
the method comprising:
the debug logic sending a debug instruction to a processor of the plurality of processors, wherein the debug instruction is communicated first over the debug connection and then over the main system bus; and
the bus arbiter prioritizing a bus transaction associated with the debug instruction bus higher or lower than a memory read or write transaction between a processor of the plurality of processors and the system memory.

* * * * *